(12) United States Patent
Chan et al.

(10) Patent No.: US 6,828,514 B2
(45) Date of Patent: Dec. 7, 2004

(54) HIGH SPEED CIRCUIT BOARD AND METHOD FOR FABRICATION

(75) Inventors: Benson Chan, Vestal, NY (US); John M. Lauffer, Waverly, NY (US); How T. Lin, Vestal, NY (US); Voya R. Markovich, Endwell, NY (US); David L. Thomas, Vestal, NY (US)

(73) Assignee: Endicott Interconnect Technologies, Inc., Endicott, NY (US)

( * ) Notice: Subject to any disclaimer, the term of this patent is extended or adjusted under 35 U.S.C. 154(b) by 0 days.

(21) Appl. No.: 10/354,000

(22) Filed: Jan. 30, 2003

(65) Prior Publication Data
US 2004/0150969 A1 Aug. 5, 2004

(51) Int. Cl.[7] .................................. H05K 7/06
(52) U.S. Cl. ........................ 174/262; 174/255; 361/780; 361/794
(58) Field of Search ................. 174/255, 261, 174/262; 361/780, 788, 794, 803; 333/246, 247

(56) References Cited

U.S. PATENT DOCUMENTS

| | | |
|---|---|---|
| 4,902,610 A | 2/1990 | Shipley |
| 5,336,855 A | 8/1994 | Kahlert et al. |
| 5,418,690 A | 5/1995 | Conn et al. |
| 5,768,109 A | 6/1998 | Gulick et al. |
| 5,891,869 A | 4/1999 | Lociuro et al. |
| 5,894,517 A | 4/1999 | Hutchison et al. |
| 5,912,809 A * | 6/1999 | Steigerwald et al. ........ 361/780 |
| 5,990,564 A * | 11/1999 | Degani et al. .............. 257/778 |
| 6,023,211 A | 2/2000 | Somei |
| 6,075,423 A | 6/2000 | Saunders |
| 6,081,430 A | 6/2000 | La Rue |
| 6,146,202 A | 11/2000 | Ramey et al. |
| 6,222,740 B1 | 4/2001 | Bovensiepen et al. |
| 6,246,010 B1 | 6/2001 | Zenner et al. |
| 6,281,446 B1 * | 8/2001 | Sakamoto et al. .......... 174/255 |
| 6,431,914 B1 | 8/2002 | Billman |
| 6,495,772 B2 | 12/2002 | Anstrom et al. |
| 2002/0079568 A1 * | 6/2002 | Degani et al. .............. 257/686 |
| 2002/0125967 A1 | 9/2002 | Garrett et al. |
| 2003/0007339 A1 * | 1/2003 | Harris et al. ................ 361/788 |

FOREIGN PATENT DOCUMENTS

JP 4025155 A2 1/1992

* cited by examiner

Primary Examiner—John B. Vigushin
(74) Attorney, Agent, or Firm—Lawrence R. Fraley; Hinman, Howard & Kattell LLC

(57) ABSTRACT

A multilayered PCB including two multilayered portions, one of these able to electrically connect electronic components mounted on the PCB to assure high frequency connections therebetween. The PCB further includes a conventional PCB portion to reduce costs while assuring a structure having a satisfactory overall thickness for use in the PCB field. Coupling is also possible to the internal portion from these components. Methods of making these structures have also been provided.

17 Claims, 6 Drawing Sheets

HIGH SPEED CIRCUIT BOARD AND METHOD FOR FABRICATION

TECHNICAL FIELD

This invention relates to multilayered printed circuit boards (PCBs) and to methods of making same. More particularly, the invention relates to such boards of the high speed type.

BACKGROUND OF THE INVENTION

As operational requirements increase for electronic structures such as electronic components, e.g., semiconductor chips and modules including same, which mount on PCBs and are coupled together through the board's circuitry, so too must the host PCB be able to compensate for same. One particular increase has been the need for higher frequency connections between the mounted components, which connections, as stated, occur through the underlying host PCB. Such connections are subjected to the detrimental effects, e.g., signal deterioration, caused by the inherent characteristics of such known PCB wiring. For example, signal deterioration is expressed in terms of either the "rise time" or the "fall time" of the signal's response to a step change. The deterioration of the signal can be quantified with the formula $(Z_0 * C.)/2$, where $Z_0$ is the transmission line characteristic impedance, and C is the amount of the via capacitance. In a wire having a typical 50 ohm transmission line impedance, a plated through hole via having a capacitance of 4 pico farad (pf) would represent a 100 pico-second (ps) rise-time (or fall time) degradation, as compared to a 12.5 ps degradation with a 0.5 pf buried via of the present invention, as discussed below. This difference is significant in systems operation at 800 MHz or faster, where there are associated signal transition rates of 200 ps or faster.

A typical high performance PCB has not been able to provide wiring densities beyond a certain point due to limitations imposed by the direct current (DC) resistance maximum in connections between components (especially chips). Similarly, high speed signals demand wider lines than normal PCB lines to minimize the "skin effect" losses in long lines. To produce a PCB with all wide lines would be impractical, primarily because of the resulting excessive thickness needed for the final board. Such increased thicknesses are obviously unacceptable from a design standpoint.

Various PCBs are described in the following patents:

| | |
|---|---|
| 4,902,610 | C. Shipley |
| 5,336,855 | J. Kahlert et al |
| 5,418,690 | R. Conn et al |
| 5,768,109 | J. Gulick et al |
| 5,891,869 | S. Lociuro et al |
| 5,894,517 | J. Hutchison et al |
| 6,023,211 | J. Somei |
| 6,075,423 | G. Saunders |
| 6,081,430 | G. La Rue |
| 6,146,202 | S. Ramey et al |
| 6,222,740 | K. Bovensiepen et al |
| 6,246,010 | R. Zenner et al |
| 6,431,914 | T. Biliman |
| 6,495,772 | D. Anstrom et al |
| US2002/0125967 | R. Garrett et al |
| JP4025155A2 | O. Takashi |

The teachings of these documents are incorporated herein by reference.

As understood from the following, a primary purpose of the present invention is to provide an improved multilayered PCB which provides for enhanced high speed connections between electronic components mounted on the board. By the term "high speed" as used herein is of course meant to mean high frequency.

It is believed that such a board and method of making same would represent a significant advancement in the PCB art.

OBJECTS AND SUMMARY OF THE INVENTION

It is, therefore, a primary object of the present invention to enhance the multilayered PCB art, by providing such a board capable of high speed signal passage to interconnect electronic components mounted on the board.

It is another object of the invention to provide a method of making such a PCB.

According to one aspect of the invention, there is provided a PCB comprising a first multilayered portion including at least one dielectric layer and at least one conductive plane wherein the conductive plane includes signal lines capable of having signals pass therealong at a first frequency, and a second multilayered portion bonded to the first multilayered portion and adapted for having a plurality of electronic components electrically coupled thereto, the second multilayered portion including at least one dielectric layer and at least one conductive plane wherein the conductive plane of the second multilayered portion includes signal lines capable of having signals pass therealong at a higher frequency than the first frequency to thereby provide a high speed connection between at least two of the electrical components.

According to another aspect of the invention, there is provided a method of making a multilayered PCB wherein the method comprises the steps of providing a first multilayered portion including at least one dielectric layer and at least one conductive plane wherein the conductive plane includes signal lines capable of having signals pass therealong at a first frequency, providing a second multilayered portion adapted for having a plurality of electronic components electrically coupled thereto, the second multilayered portion including at least one dielectric layer and at least one conductive plane wherein the conductive plane of the second multilayered portion includes signal lines capable of having signals pass therealong at a higher frequency than the first frequency to thereby provide a high speed connection between at least two of the electrical components, and bonding the first and second multilayered portions.

According to yet another aspect of the invention, there is provided an information handling system comprising a PCB including a first multilayered portion including at least one dielectric layer and at least one conductive plane wherein said conductive plane includes signal lines capable of having signals pass therealong at a first frequency, and a second multilayered portion bonded to said first multilayered portion and adapted for having a plurality of electronic components electrically coupled thereto, said second multilayered portion including at least one dielectric layer and at least one conductive signal plane wherein said conductive signal plane of said second multilayered portion includes signal lines capable of having signals pass therealong at a higher frequency than said first frequency to thereby provide a high speed connection between at least two of said electrical components.

BEST MODE FOR CARRYING OUT THE INVENTION

For a better understanding of the present invention, together with other and further objects, advantages and capabilities thereof, reference is made to the following disclosure and appended claims in connection with the above-described drawings. It is understood that like numerals will be used to indicate like elements from FIG. to FIG.

As stated above, the term "high speed" as used herein is meant signals of high frequency. Examples of such signal frequencies attainable for the multilayered PCBs defined herein and as produced using the methods taught herein include those within the range of from about 3.0 to about 10.0 gigabits per second (GPS). These examples are not meant to limit this invention, however, because frequencies outside this range, including those higher, are attainable. As further understood from the following, the PCB products produced herein are formed of at least two separate multilayered portions (subassemblies) which have themselves been formed prior to bonding to each other. At a minimum, each of these separate portions will include at least one dielectric layer and one conductive layer, with most likely embodiments including several layers of each as part thereof. Examples are provided below and are just that (only examples) and the numbers of layers shown and described are not meant to limit the scope of this invention.

The products as defined herein are particularly adapted for use in what can be termed "Information Handling Systems". By the term "Information Handling System" as used herein shall mean any instrumentality or aggregate of instrumentalities primarily designed to compute, classify, process, transmit, receive, retrieve, originate, switch, store, display, manifest, measure, detect, record, reproduce, handle or utilize any form of information, intelligence or data for business, scientific, control or other purposes. Examples include personal computers and larger processors such as servers, mainframes, etc.

Figure 1:
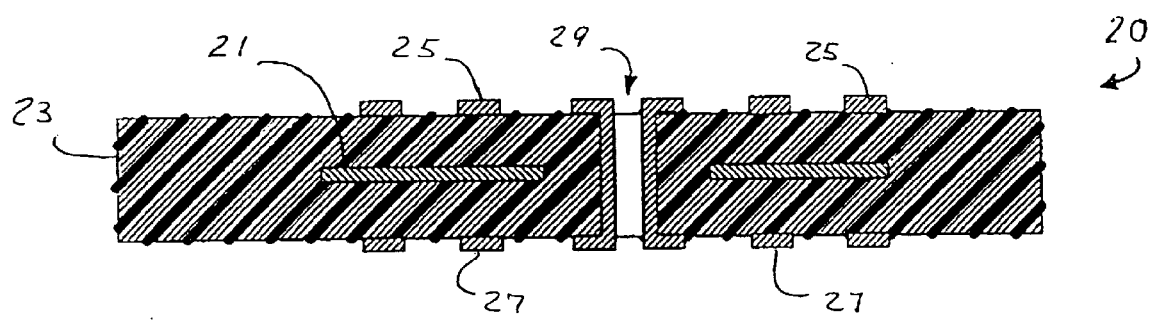
FIG. 1 is a side elevational view, in section, of one portion of a multilayered PCB according to one aspect of the present invention.
Figure 2:
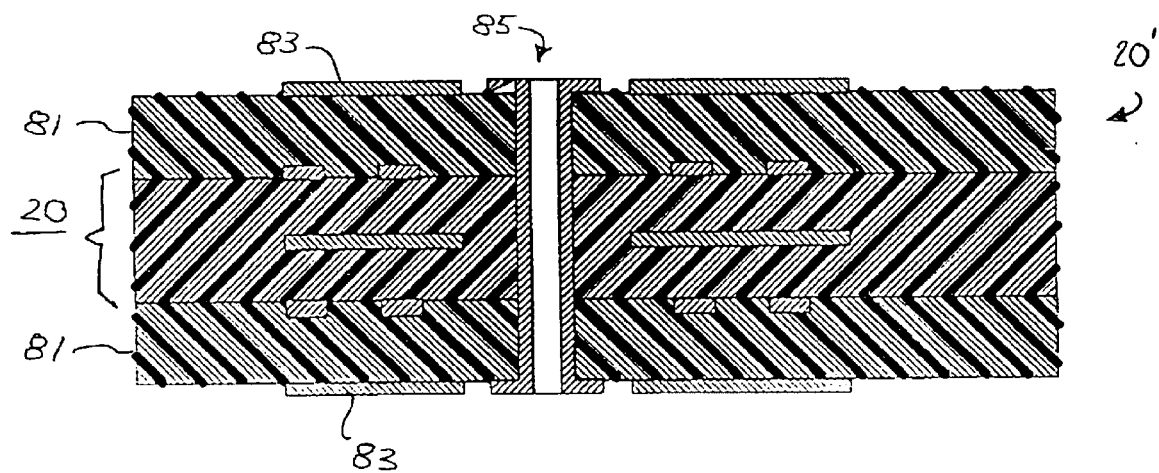
FIG. 2 is a side elevational view, in section, of one portion of a multilayered PCB according to another aspect of the invention.

In FIGS. 1 and 2, there are shown two embodiments of multilayered portions 20 and 20', respectively, which, when bonded to another multilayered portion will form the printed circuit board (PCB) according to a preferred embodiment of the invention. Accordingly, portions 20 and 20' will be defined herein as second portions while the other portion will be referred to as the first (or base) portion. It is to be understood that in accordance with the broad aspects of this invention, at least one second portion is to be bonded to the first portion such that this second portion lies substantially along the external portions of the final PCB product. It is also understood that one or more of such second portions may be bonded to the base, first portion, including on opposite sides thereof such as depicted in FIGS. 3–6. Most significantly, the second portions as defined herein are specifically designed for providing high frequency (high speed) connections between electronic components such as chip modules or even simply individual chips mounted (e.g., soldered) to the second portions and/or otherwise electrically coupled thereto. Importantly, the first or base portion will not necessarily require such capability but instead can be formed in the regular manner for most current PCBs, many of which are described in the above-listed documents. This invention thus allows the utilization of known PCB manufacturing techniques to produce a resulting structure with significantly increased capability such that electronic components secured thereto can be connected at higher speeds than heretofore attainable. Such connections are considered essential in the rapidly expanding PCB art due primarily to the corresponding increased requirements of such components. The present invention as defined herein thus provides a significant advancement in the art.

In FIG. 1, multilayered portion 20 is shown as including a central conducting plane 21 which, in a preferred embodiment, serves as a power plane. Plane 21 is surrounded by two layers of dielectric material 23, shown in the drawing as one continuous structure due to the bonding (lamination) of both layers onto plane 21. On the external surfaces of dielectric material 23 are located additional conductive planes 25 and 27, which in a preferred embodiment of the invention comprise a series of signal lines. Portion 20 can thus be simply referred to as a 2S1P structure, meaning it comprises two signal planes and one power plane. A conductive through hole 29 is also provided to connect the upper signal plane 25 with lower plane 27. In a preferred embodiment, the conductive through hole is a plated through hole (PTH), produced using known technologies. The formation of portion 20 is accomplished using known PCB procedures, including lamination of the aforementioned dielectric layers and deposition (e.g., plating) of the external signal planes. Further process description is thus not believed necessary.

As mentioned, portion 20 is designed for providing high speed (high frequency) connections between electronic components coupled thereto when portion 20 is formed in combination with another multilayered portion to form a final PCB. In order to provide such high speed connections, therefore, the individual signal lines in portion 20 (and 20') preferably possess a width of from about 0.005 inch to about 0.010 inch and a thickness of 0.0010 to about 0.0020 inch. The corresponding dielectric layers each possess a thickness of from about 0.008 inch to about 0.010 inch. The material for planes 21, 25 and 27 is preferably copper, but other conductive materials are possible. The preferred dielectric material 23 is a low loss dielectric, one example being polyclad LD621, available from Cookson Electronics, located in West Franklin, N.H. Additional materials include Nelco 6000SI, available from Park Nelco, located in Newburgh, N.Y. and Rogers 4300, available from Rogers Corporation, located in Rogers, Conn. These materials have a low dielectric constant and loss factor to provide the optimum operational capabilities for the structure. Other materials possessing dielectric loss $\leq 0.01$, and preferably less than <0.005 would be suitable for use in both portions 20 and 20'.

It is understood that the above thicknesses and defined materials are not meant to limit the scope of this invention, in that others are possible while attaining the desired results taught herein. In one example, using the aforementioned thicknesses, widths and materials, it was possible to provide a second portion 20 (and 20') capable of passing signals at a signal frequency within the range of from about 3 to about 10 GPS. This is also not meant to limit the invention in that higher frequencies, e.g., 12 GPS, are possible with relatively insignificant modification to one or more of the above materials, parameters, etc. The resulting overall thickness for portion 20 as defined, according to one embodiment, is about 0.140 inch.

Although it is not a necessary requirement of the present invention, the aforementioned widths and thicknesses for the conductive planes and dielectric layers will normally be thicker than those for the base or first multilayered portion to which portions 20 and 20' will be bonded. That is, the base portions will typically include much less thickness and width dimensions for the conductive planes and dielectrics used therein, such widths, thicknesses and materials being typical of those of known PCB structures used today. Thus, further description will not be necessary.

Figure 3:
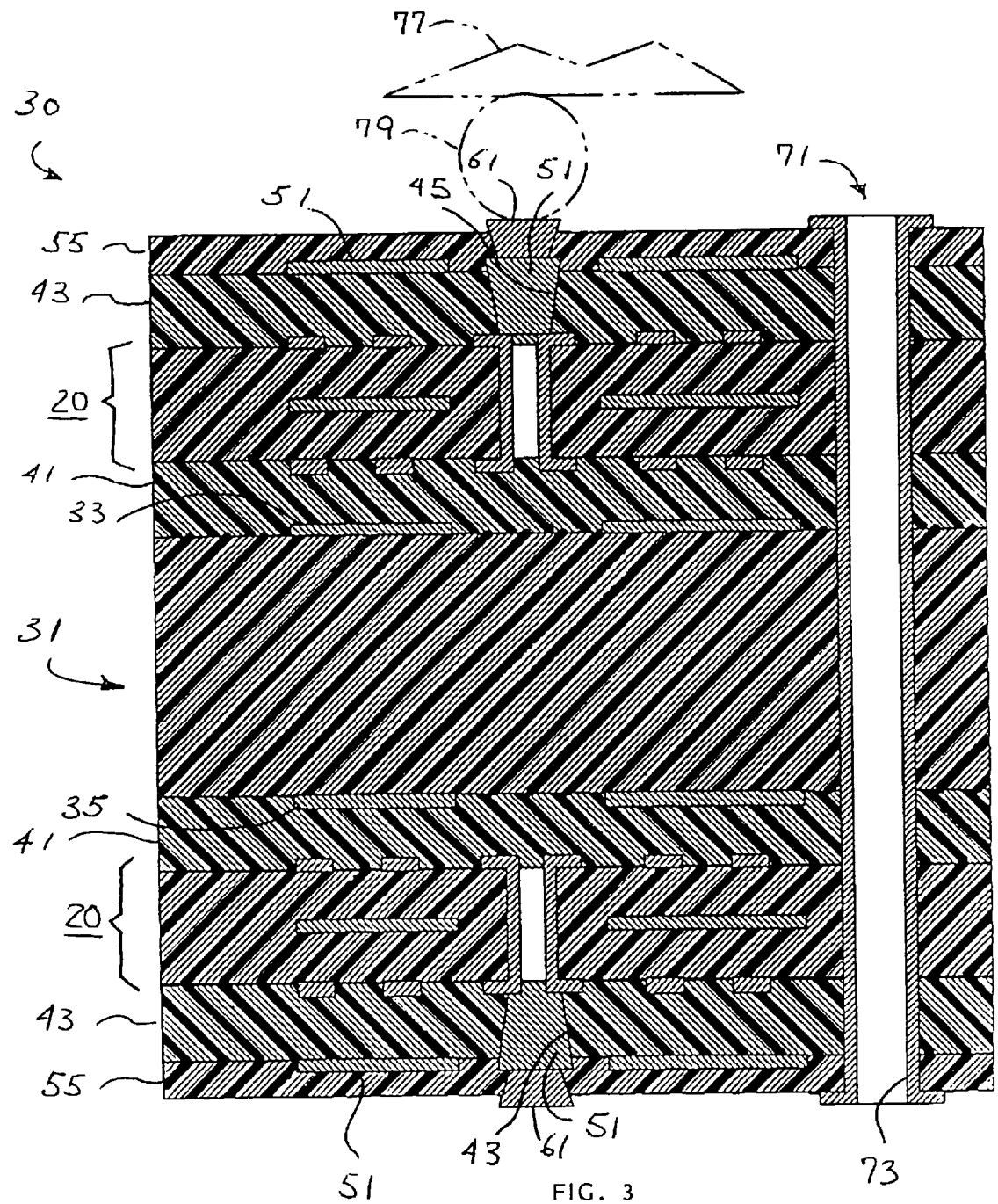
FIG. 3 is a side elevational view, in section, of a multilayered PCB according to one aspect of the invention.

FIG. 3 illustrates an embodiment of a printed circuit board 30 in which two second portions 20 are utilized, each of these portions located on opposite sides of a common first multilayered portion 31. First portion 31 is illustrated, for simplification purposes, as a singular dielectric layer including outer conductive layers 33 and 35 thereon. In one embodiment, layers 33 and 35 are power or ground planes, depending on the operational requirements of the final board 30. In a preferred embodiment, portion 31 will include several (e.g., twenty) conductive planes therein of signal, ground and/or power capabilities and a corresponding plurality (e.g., nineteen) of dielectric layers. In its simplest form, portion 31 (and 31' in FIGS. 4–6) will include at least one signal plane passing signals therealong at a first frequency. As indicated earlier, both conductive planes and dielectric layers used in the first multilayered portion 31 are typically those utilized in a conventional PCB. Therefore, in one example, portion 31 may include conductive signal lines having widths of about 0.003 inch to about 0.010 inch and corresponding thicknesses of 0.0005 inch. The dielectric layers each include an initial thickness of about 0.010 inch. First portion 31, being of such multilayered construction, is laminated together to bond the several conductive dielectric layers to form the first portion 31. Additionally, second portions 20 are similarly formed as separate, multilayered subassemblies as described above. In the next step, a dielectric layer 41 (e.g., conventional pre-preg material) is added to opposite sides of the interim first portion 31 and another dielectric layer 43 is added to each of the outermost surfaces portions 20. This structure is now laminated to form a singular, multilayered PCB, using standard lamination processing. Because of the structural characteristics explained above and herein, at least some of the signal planes in second portions 20 and 20' will provide higher frequency signal passage than at least some of the signal lines in the conventional first portions 31 and 31'. In a preferred embodiment, all signal lines in the external portions will possess such superior capabilities compared to the signal layers of the first portions these are bonded to.

To access one or more of the outer conductive planes on each portion 20, openings 45 are provided within the outer dielectric layers 43. This is preferably done by laser or photoprinting operations known in the art. Following removal of the dielectric material, an outer conductive layer 51 is added on opposite sides of the structure in FIG. 3, including within the openings in the dielectric. At this point, connections for components are provided on PCB 30 that couple to the signal lines of portions 20 which in turn will assure high speed signal passage along these signal lines, including those on the upper and lower surfaces of each portion 20, to a second electronic component (not shown) also coupled to the circuitry of the same portion 20, e.g., at a site to the left of the viewer in FIG. 3. Such connection would also be provided through an opening in conductive material 51 as shown in FIG. 3.

It is understood in FIG. 3 that two or more electronic components can be mounted on each of the opposite sides of PCB 30 and coupled together with high frequency signals. The PCB of the present invention is thus able to uniquely couple high speed components on opposite surfaces thereof to assure a finished PCB-component assembly possessing far greater operational capabilities than heretofore known in the art.

For additional coupling, another layer of dielectric material 55 may also be added to cover the conductive planes 51, in which case, connection to the conductive material 51 within opening 45 would be accomplished by a similar opening and conductive material 61 in FIG. 3 to electrically couple components on one side of PCB 30. A plated through hole (PTH) 71 may be utilized to extend through the entire thickness of PCB 30, as illustrated to the right in FIG. 3. Such a through hole could be formed using conventional techniques and would include, e.g., a thin plated layer of conductive material (e.g., copper) on the surfaces thereof. This through hole may also be used to accept a conductive pin or the like if such an added component is desired. PTH 71 can also couple one or more components to internal conductive planes in first portion 31.

One example of an electronic component is illustrated in phantom in FIG. 3. Such an electronic component may include an electronic module or semiconductor chip 77 coupled to the conductive material 61 (or, alternatively, directly to material 51 should material 61 not be utilized) using a solder ball 79. Alternatively, such a component could include a projecting metallic lead which in turn would be connected, e.g., soldered, to material 61. Such components and means of connection are known in the art and further description is not believed necessary.

Returning to FIG. 2, the portion 20' includes similar components to those of portion 20 in FIG. 1 but represents an alternative embodiment for forming a multilayered PCB using the teachings herein. Portion 20' includes as part thereof the 2S1P portion 20 therein. Dielectric layers 81 are added on opposite surfaces of portion 20, following which conductive layers 83 are then applied, e.g., via plating. The conductive layers 83 are preferably ground or power planes and are coupled together by a plated through hole 85 as shown. Like portion 20, several such through holes are utilized in the second portions to provide such connections. Only one is shown in both FIGS. 1 and 2 for illustration purposes. Dielectric layers 81 are preferably of similar material as the low loss dielectric layers used in portion 20. The layers of portion 20', like portion 20, are assembled using conventional lamination processing.

Figure 4:
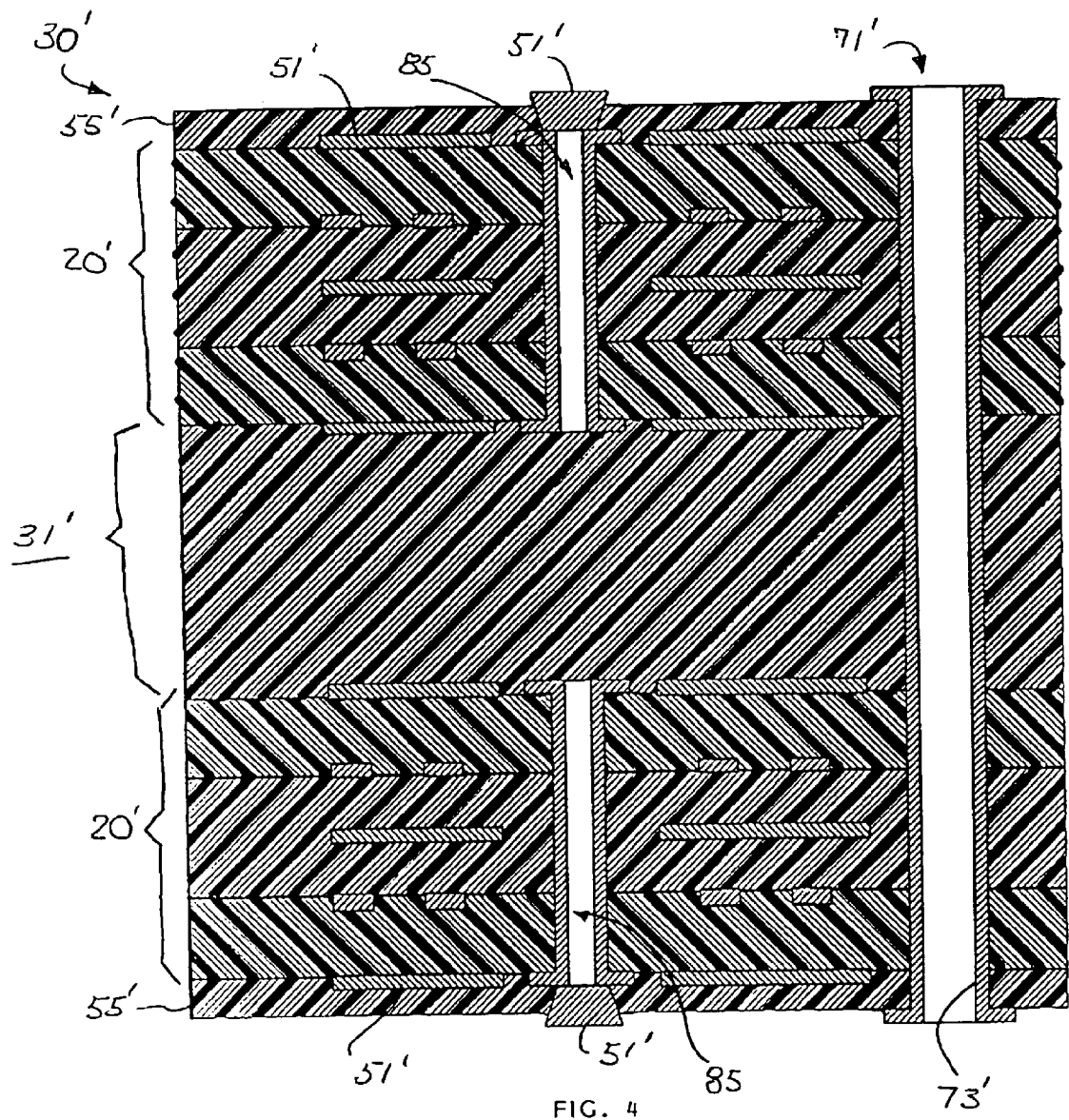
FIG. 4 is a side elevational view, in section, of a multilayered PCB according to another aspect of the invention.

In FIG. 4, two second portions 20' are shown bonded to a common, interim multilayered first portion 31' which, in a preferred embodiment and as stated above, includes several internal conductive planes (not shown) bonded by a corresponding number of individual dielectric layers (also not shown) to form the elements of a known PCB. The embodiment of FIG. 2 thus represents a simpler means of producing a final PCB (30' in FIG. 4) because of the fewer lamination steps necessary during the final bonding operations. That is, it is only necessary to laminate the three previously formed multilayered structures 20' and 31' shown in FIG. 4. Again, it is noteworthy that only one outer portion 20' may be bonded to an underlying conventional PCB 31' in accordance with the broader aspects of this invention. Following complete lamination, an outer dielectric layer 55' may be added to the structure and a conductive opening 51' provided therein using similar techniques to those defined for providing the opening 45 and conductive material 51 in FIG. 3. A plated through hole 85 will couple any component joined to material 51' to the top and/or bottom layers of portion 20', if desired. To couple the outermost surfaces of PCB 30', a common through hole 71' is provided, similarly to through hole 71 in FIG. 3. Such a through hole would preferably include the plated conductive material 73' similar to that in FIG. 3.

Of further significance, the through holes 71 and 71' can be used to electrically couple one or more of the electronic components to the internal wiring of the first multilayered portions 31 and 31', respectively, thus providing a direct electrical connection between these components and the interim structure. Thus, the present invention provides the unique capability of assuring coupling between the components on one side of the board in addition to coupling of these same components to internal conductive planes of the base or first portion of the overall structure. Such dual coupling represents a significant aspect of the invention because it results in a final PCB product having greater operational capabilities than heretofore known products.

Figure 5:
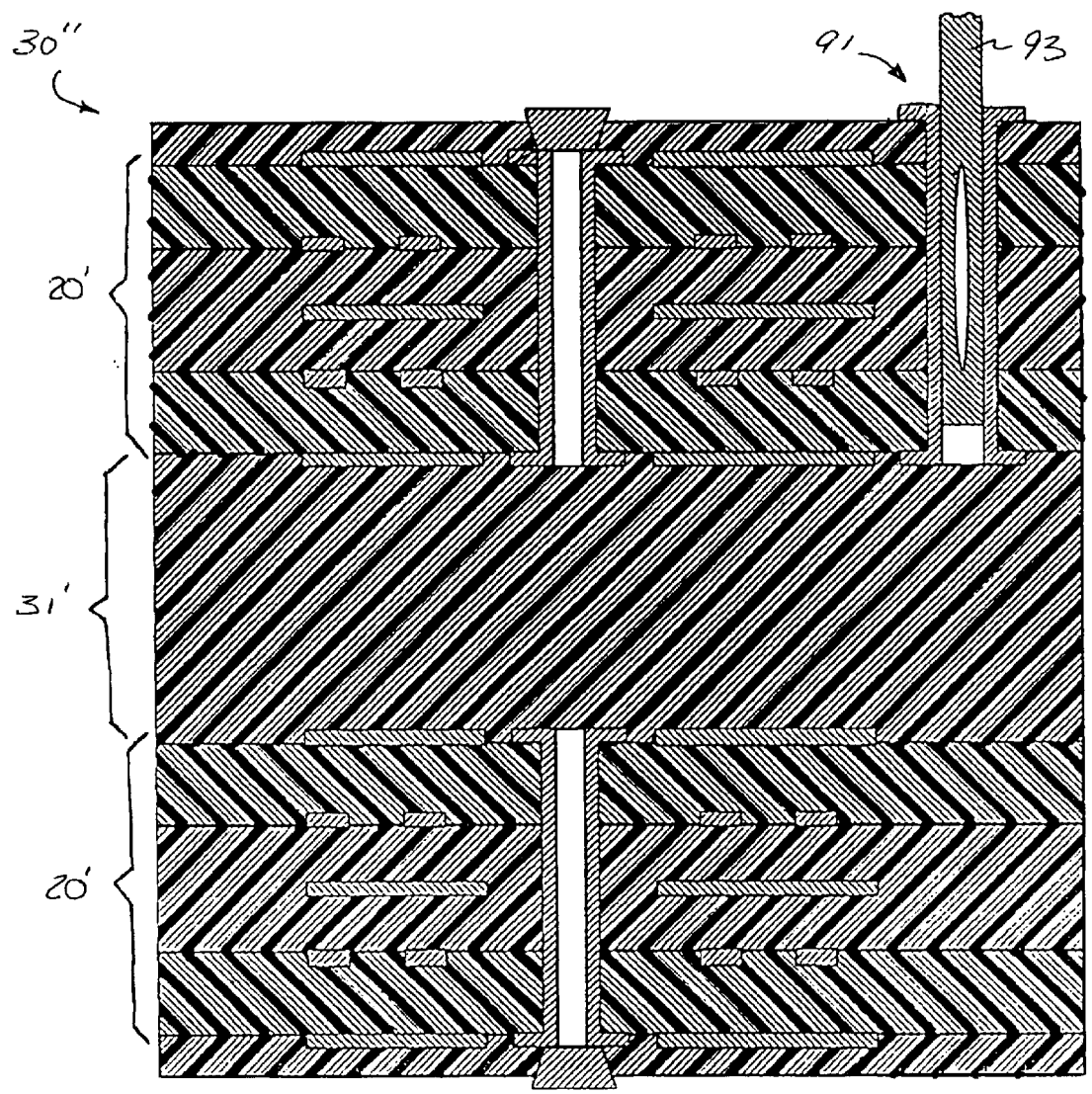
FIG. 5 is a side elevational view, in section, of a multilayered PCB according to yet another aspect of the invention.
Figure 6:
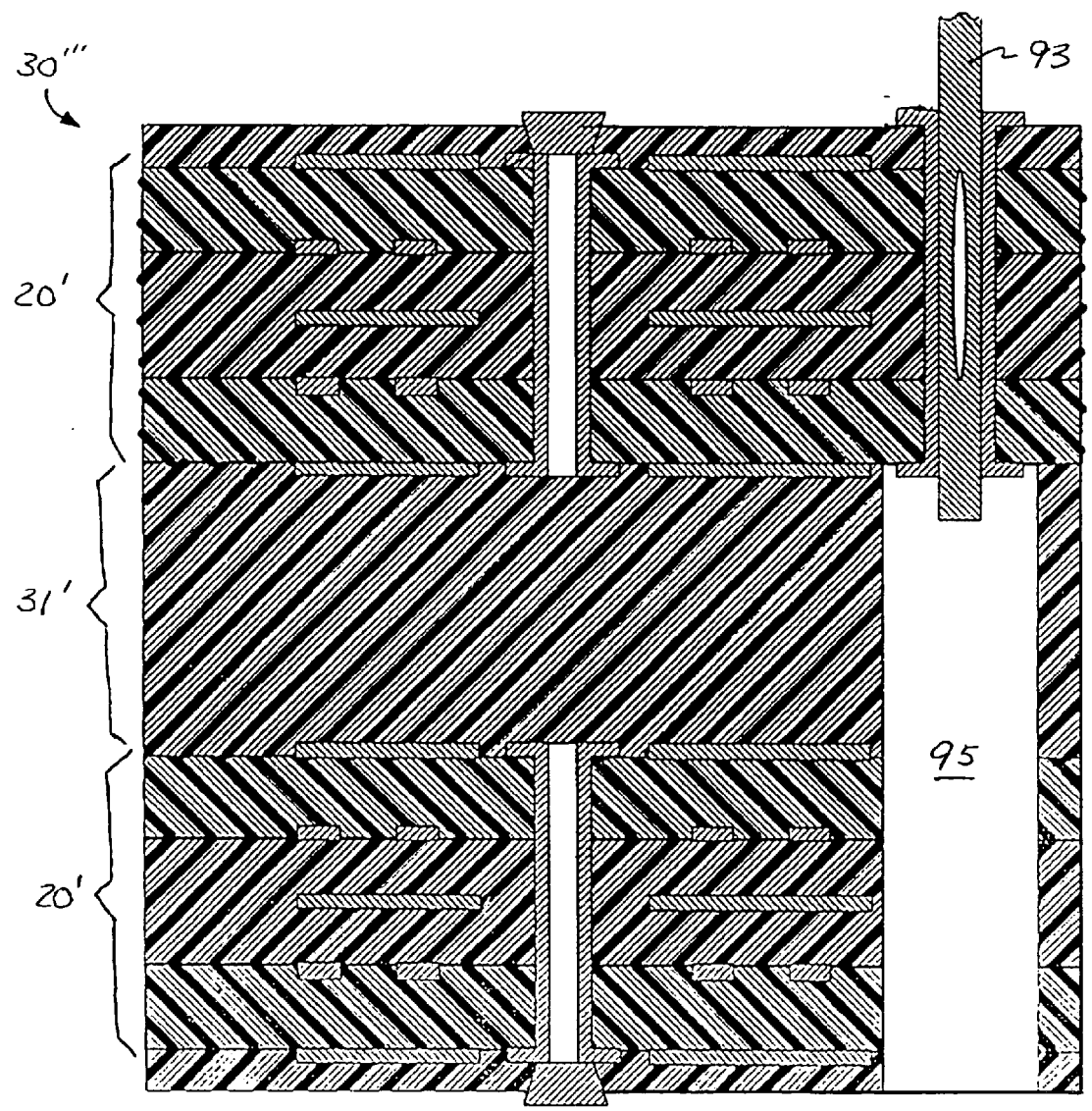
FIG. 6 is a side elevational view, in section, of a multilayered PCB according to still another aspect of the invention.

In FIGS. 5 and 6, there are shown two alternative PCB embodiments 30'' and 30''', respectively, of the present invention. The structure of PCB 30'' in FIG. 5 is similar to that shown in FIG. 4 with the addition of a conductive through hole 91 extending from an outer surface of PCB 30'' to one of the conductive planes of portion 20'. Coupling of a pinned component (i.e., the pin 93 shown in FIGS. 5 and 6) is thus possible, in addition to the aforedefined coupling of additional electronic components. In the embodiment of FIG. 6, an elongated opening 95 is provided through the portion 31' and the lower portion 20'. The reason for providing opening 95 is to provide proper clearance for inserting pin 93. Opening 95 can be preformed (drilled) on 31' and 20' before final lamination, contrasting to the conventional method of "back drilling" in order to eliminate the unused portion of the PTH. Back drilling removes a portion of the PTH layer of copper. This reduces the capacitive effects of the PTH when dealing with high speed signals. Back drilling is expensive and difficult to perform. The construction provided negates the need for back drilling and achieves the same effects.

Figure 7:
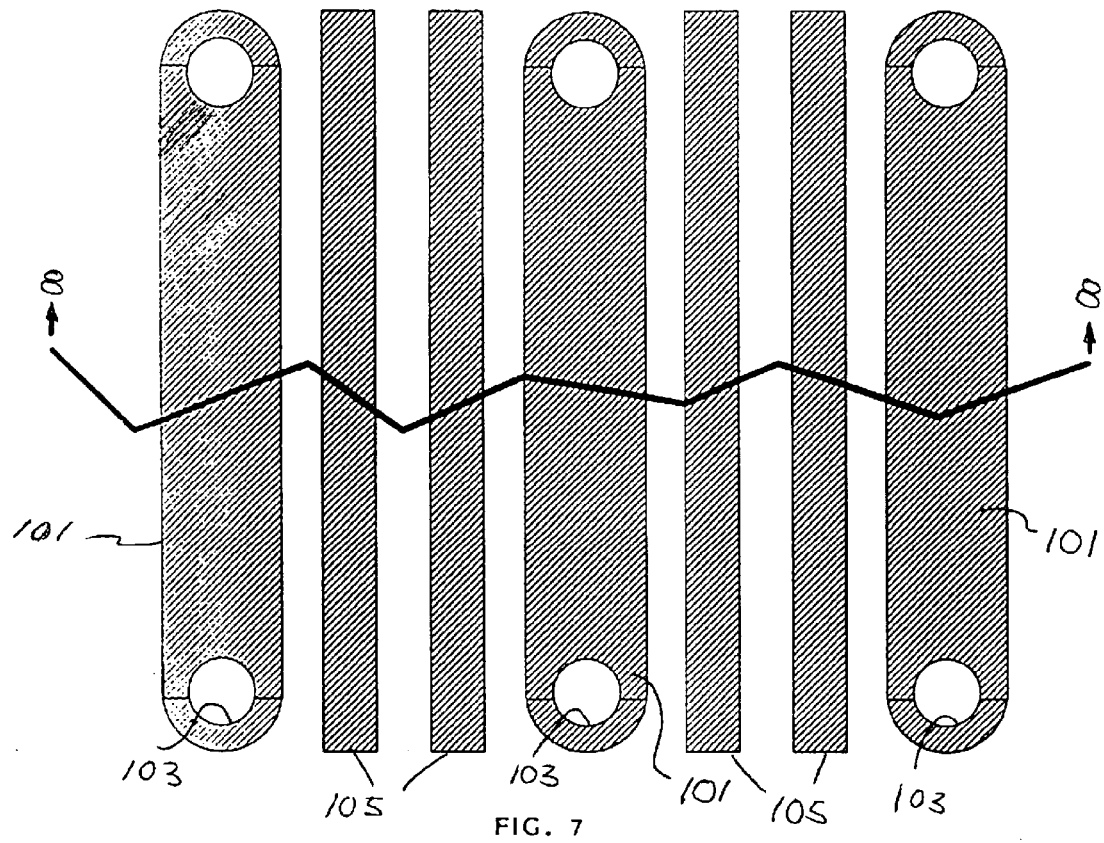
FIG. 7 is a top plan view illustrating a circuit pattern that may be used on a multilayered PCB according to one aspect of the invention.
Figure 8:
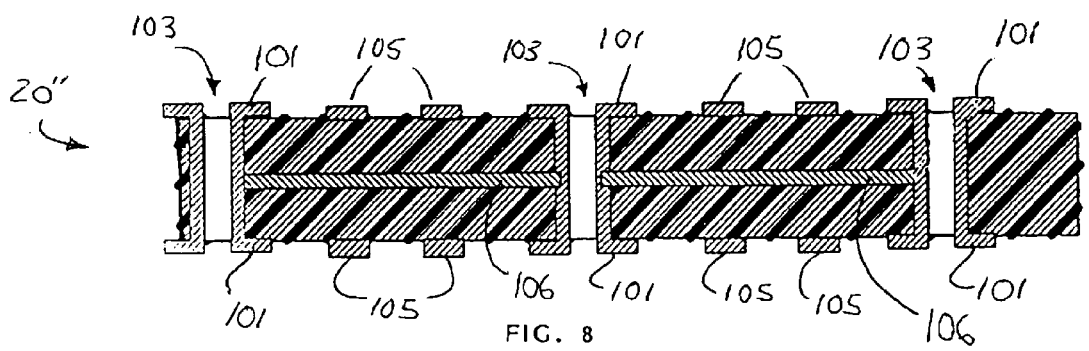
FIG. 8 is a side elevational view, in section, taken along the line 7—7 in FIG. 7.

FIGS. 7 and 8 represent an embodiment of a second portion 20'' according to another aspect of the invention. Understandably, FIG. 8 is a sectional view taken along the line 8—8 in FIG. 7 and serves to illustrate one embodiment of the respective widths of conductors on the upper surface of portion 20''. The through holes located at respective ends of the broader width conductors are also shown. In this arrangement, the broader width conductors 101 serve as signal lines to interconnect plated through holes 103 at the opposite ends thereof. In comparison, the narrower width signal lines 105 extend in paired relationship between the respective outer pairs of the wider lines 101. In one embodiment, lines 101 may possess a width of from about 0.003 inch to about 0.012 inch while the corresponding internal, narrower lines each may possess a width of 0.02 inch to about 0.10. These lines were spaced apart a distance of from about 0.03 inch to about 0.12 inch. The purpose of providing the greater width lines 101 on opposite sides of the paired narrower signal lines 105 is to provide proper trace impedance control as well as signal shielding to minimize noise coupling amongst signal lines. As seen in FIG. 8, these lines are positioned on opposite sides of portion 20'', with the narrower lines 105 located externally of an interim conductive (e.g., power) plane 106 coupled to the center PTH 103. This arrangement provides the advantageous feature of a continuous reference plane that can provice maximum signal shielding. This provides for simpler construction of subcomposites and also allows for sections with Z connections that can have different dielectric thicknesses; for example, fast signals vs. slower signals.

Thus there has been shown and described a multilayered PCB which provides a high speed portion for connecting semiconductor chips and other electronic components located on one surface together, in addition to coupling these components to internal conductors of the PCB and/or to components on the opposite side, if desired. Thus, the PCB as defined herein is capable of coupling components on opposite surfaces thereof as well. The methods taught herein for producing such a structure are cost worthy and well within the capabilities of those versed in the PCB manufacturing art. Thus, the invention can be produced at relatively low costs to the ultimate consumer.

While there have been shown and described what are at present the preferred embodiments of the invention, it will be obvious to those skilled in the art that various changes and modifications may be made therein without departing from the scope of the invention as defined by the appended claims.

What is claimed is:

1. A printed circuit board PCB comprising:

a first multilayered portion including at least one dielectric layer and least one conductive plane wherein said conductive plane includes signal lines capable of having signals pass therealong first frequency;

a second multilayered portion bonded to said first multilayered portion and adapted for having a plurality of electronic components electrically coupled thereto, said second multilayered portion including a conducting plane, first and second dielectric layers on opposite sides of said conducting plane, and two conductive signal planes, each conductive signal lane including signal lines capable of having signals pass therealong at a higher frequency than said first frequency to thereby provide a high speed connection between at least two of said electrical components, said two conductive signal planes being positioned, respectively, on said first and second dielectric layers opposite said conducting plane, said second multilayered portion further including a conductive through hole interconnecting at least one of said signal lines of a first of said two conductive signal planes to at least one of said signal lines of the of said conductive signal plane; and a third dielectric layer positioned on said second dielectric layer and said conductive signal plane positioned thereon, said third dielectric layer including at least one opening therein exposing at least one of said signal lines on said conductive signal plane positioned on said second dielectric layer such that at least one of said electrical components can be electrically coupled thereto.

2. The PCB of claim 1 wherein said at least one opening includes a layer of conductive material.

3. The PCB of claim 1 wherein said conductive through hole interconnecting at least one of said signal lines of said conductive signal plane on said first dielectric layer with at least one of said signal lines of said conductive signal plane on said second dielectric layer interconnects said at least one of said signal lines of said conductive signal plane on said first dielectric layer to said at least one signal line exposed by said opening in said third dielectric layer.

4. The PCB of claim 1 further including conductive plane located on said third dielectric layer.

5. The PCB of claim 4 further including a fourth dielectric layer positioned on said third dielectric layer and on said conductive plane located on said third dielectric layer, said fourth dielectric layer including at least one opening therein exposing said at least one opening in said third dielectric layer.

6. The PCB of claim 5 wherein said both of said at least one openings in said third and fourth dielectric layers includes a layer of conductive material thereon, said layers of conductive material being electrically coupled together, said at least one of said electrical components adapted for being electrically coupled to said layer of conductive material in said at least on opening in said fourth dielectric material.

7. The PCB of claim 1 wherein the signal rate of said high speed connection in said second multilayered portion is from about three to about ten gigabits per second.

8. A printed circuit board (PCB) comprising:
a first multilayered portion including at least one dielectric layer and at least one conductive plane wherein said conductive plane includes signal lines capable of having signals pass therealong at a first frequency; and
a second multilayered portion including to said first multilayered portion and adapted for having a plurality of electronic components electrically coupled thereto, said second multilayered portion including at least one dielectric layer and at least one conductive signal plane wherein said conductive signal plane of said second multilayered portion includes signal lines capable of having signals pass therealong at a higher frequency than said frequency to thereby provide a high speed connection between at least two of said electrical components, said at least one dielectric layer in said second multilayered portion has a lower dielectric constant than said at least one dielectric layer in said first multilayered portion.

9. The PCB of claim 8 wherein the signal rate of said high speed connection in said second multilayered portion is from about three to about ten gigabits per second.

10. A printed circuit board (PS) comprising:
a first multilayered portion including at least one dielectric layer and at least one conductive plane wherein said conductive plane includes signal lines capable of having signals pass therealong at a first frequency; and
a second multilayered portion bonded to said first multilayered portion adapted for having a plurality of electronic components electrically coupled thereto, said second multilayered portion including at least one dielectric layer and at least one conductive signal plane wherein said conductive signal plane of said second multilayered portion includes signal lines capable of having signals pass therealong at a higher frequency than said frequency to thereby provide a high speed connection between at least two of said second electrical components, said at least one dielectric layer in said second multilayered portion has a lower loss factor than said at least one dielectric layer in said first multilayered portion.

11. The PCB of claim 10 wherein the signal rate of said high speed connection in said second multilayered portion is from about three to about ten gigabits per second.

12. An information handling system comprising a PCB including a first multilayered portion including at least one dielectric layer and at least one conductive plane wherein said conductive plane includes signal lines capable of having signals pass therealong at a first frequency, and a second multilayered portion bonded to said first multilayered portion and adapted for having a plurality of electronic components electrically coupled thereto, said second multilayered portion including a conducting plane, first and second dielectric layers on opposite sides of said conducting plane, and two conductive signal planes, each conductive signal plane including signal lines capable of having signals pass therealong at a higher frequency than said first frequency to thereby provide a high speed connection between at least two of said electrical components, said two conductive signal planes being positioned, respectively, on said first and second dielectric layers opposite said conducting plan said second multilayered portion further including a conductive through hole interconnecting at least one of said signal lines of a first of said two conductive signal planes to at least one of said signal lines of the second of said conductive signal lane, and a third dielectric layer positioned on said second dielectric layer and said conductive signal plane positioned thereon, said third dielectric layer including at least one opening therein exposing at least one of said signal lines on said conductive signal plane positioned on said second dielectric layer such that at least one of said electrical components can be electrically coupled thereto.

13. The information handling system of claim 12 wherein the signal rate of said high speed connection in said second multilayered portion is from about three to about ten gigabits per second.

14. An information handling system comprising a PCB including a first multilayered portion including at least one dielectric layer and at least one conductive plane wherein said conductive plane includes signal lines capable of having signals pass therealong at a first frequency, and a second multilayered portion bonded to said first multilayered portion and adapted for having a plurality of electronic components electrically coupled thereto, said second multilayered portion including at least one dielectric layer and at least one conductive signal plane wherein said conductive signal plane of said second multilayered portion includes signal lines capable of having signals pass therealong at a higher frequency than said first frequency to whereby provide a high speed connection between at least two of said electrical components, said at least one dielectric layer in said second multilayered portion has a lower dielectric constant than said at least one dielectric layer in said first multilayered portion.

15. The information handling system of claim 14 wherein the signal rate of said high speed connection in said second multilayered portion is from about three to about ten gigabits per second.

16. An information handling system comprising a PCB including a first multilayered portion including at least one dielectric layer and at least one conductive plane wherein said conductive plane includes signal lines capable of having signals pass therealong at a first frequency, a second multilayered portion bonded to said first multilayered portion and adapted for having a plurality of electronic components electrically coupled thereto, said second multilayered portion including at least one dielectric layer and at least one conductive signal plane wherein said conductive signal plane of said second multilayered portion includes signal lines capable of having signals therealong at a higher frequency than said first frequency thereby provide a high speed connection between at least two of said electrical components, said at least one dielectric layer in said second multilayered portion has a lower loss factor than said at least one dielectric layer in said multilayered portion.

17. The information handling system of claim 16 wherein the signal rate of said high speed connection in said second multilayered portion is from about three to about ten gigabits per second.

\* \* \* \* \*

UNITED STATES PATENT AND TRADEMARK OFFICE
CERTIFICATE OF CORRECTION

PATENT NO. : 6,828,514 B2
DATED : December 7, 2004
INVENTOR(S) : B. Chan et al.

It is certified that error appears in the above-identified patent and that said Letters Patent is hereby corrected as shown below:

Column 8,
Line 34, delete "PCB" and insert -- (PCB) --;
Line 39, insert -- at a -- after "therealong";
Line 45, delete "lane" and insert -- plane --;
Line 55, insert -- second -- after "the";

Column 9,
Line 8, insert -- a -- after "including";
Line 32, delete "including" and insert -- bonded --;
Line 40, insert -- first -- after "said";
Line 49, delete "(PS)" and insert -- (PCB) --;
Line 55, insert -- and -- after "portion";
Line 62, insert -- first -- after "said";

Column 10,
Line 22, delete "plan" and insert -- plane, --;
Line 27, delete "lane" and insert -- plane --;
Line 52, delete "whereby" and insert -- thereby --;
Line 67, insert -- and -- after "frequency";

Column 11,
Line 7, insert -- pass -- after "signals";
Line 8, insert -- to -- after "first frequency";

Column 12,
Line 3, insert -- first -- after "said".

Signed and Sealed this

Thirteenth Day of September, 2005

JON W. DUDAS
*Director of the United States Patent and Trademark Office*